United States Patent [19]

Clarke

[11] Patent Number: 5,135,634
[45] Date of Patent: Aug. 4, 1992

[54] APPARATUS FOR DEPOSITING A THIN LAYER OF SPUTTERED ATOMS ON A MEMBER

[75] Inventor: Andrew P. Clarke, Carpinteria, Calif.

[73] Assignee: Sputtered Films, Inc., Santa Barbara, Calif.

[21] Appl. No.: 655,065

[22] Filed: Feb. 14, 1991

[51] Int. Cl.$^5$ .................. C23C 14/34; C23C 14/35
[52] U.S. Cl. .................. 204/298.06; 204/298.09; 204/298.11; 204/298.18
[58] Field of Search .................. 204/298.06, 298.09, 204/298.11, 298.18

[56] References Cited

U.S. PATENT DOCUMENTS 4,100,055  7/1978  Rainey .................. 204/298.12
4,297,189  10/1981  Smith, Jr. et al. .................. 204/192.18

Primary Examiner—Aaron Weisstuch
Attorney, Agent, or Firm—Ellsworth R. Roston; Charles H. Schwartz

[57] ABSTRACT

A target releases electrons to an anode through a cavity containing gaseous atoms (e.g. argon) having properties of becoming ionized by electron impingement. Magnetic and electrical fields increase the distance of electron travel between the anode and the target, thereby enhancing ion formation from the gaseous atoms. The ions bombard the target and cause it to emit sputtered atoms (e.g. aluminum) which are deposited on a substrate (e.g. wafer) displaced from the target. In one embodiment, a shield disposed between the target and the substrate is shaped, and has a potential, to attract charged particles and prevent them from moving to the substrate. This allows the wafer to be disposed close to the target, thereby enhancing the density, and the thickness uniformity, of the deposition on the substrate. The shield also acts as a getter to remove impurities (e.g. water molecules) from the space between the target and the substrate. In another embodiment the shield has a positive potential to attract electrons and repel ions, thereby funneling ions toward the substrate. The funnel shape is dependent upon the shield voltage. A hood displaced slightly (e.g. 50 mils) from the shield is shaped, and has a potential (e.g. ground), to attract charged particles near the hood and outside of the funnel. The funneled ions and sputtered atoms are deposited on the substrate to generate heat in the substrate, thereby enhancing the properties of the substrate deposition. Sputtered atoms between the shield and the hood form a dielectric to prevent any voltage breakdown between the shield and the hood.

20 Claims, 3 Drawing Sheets

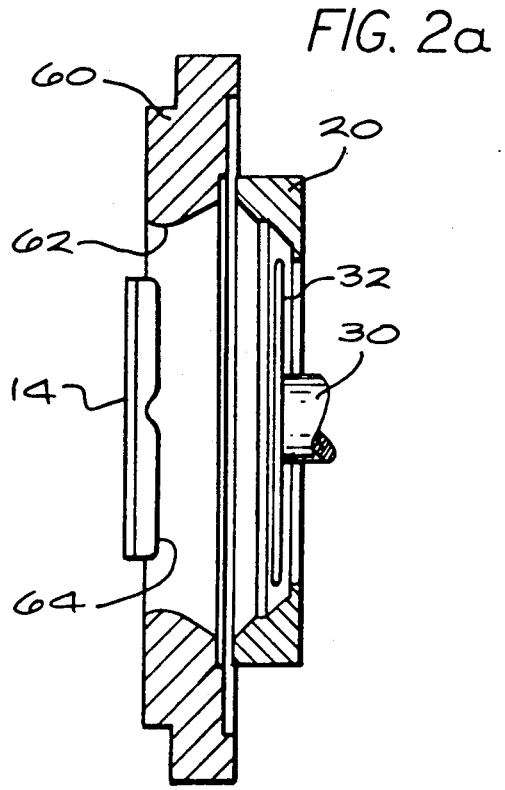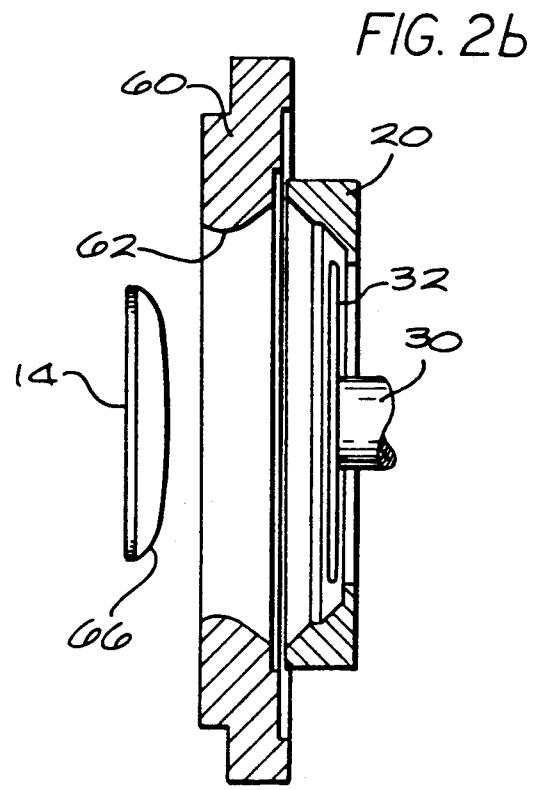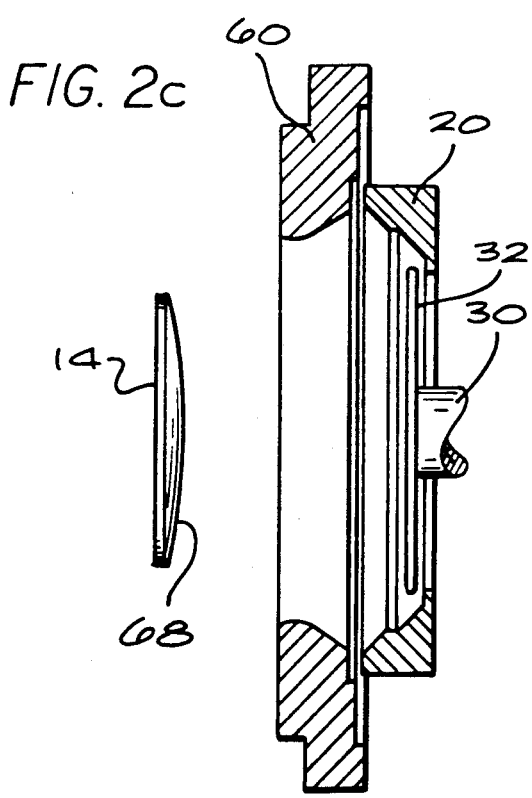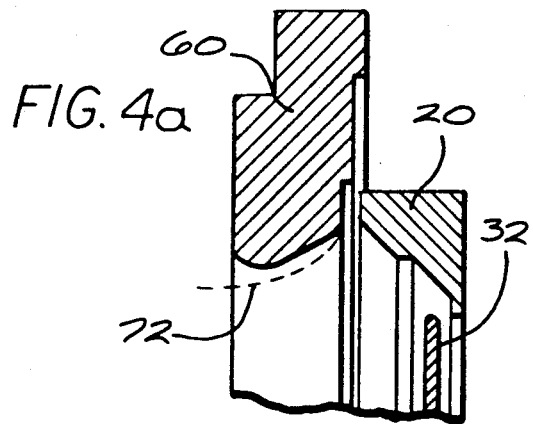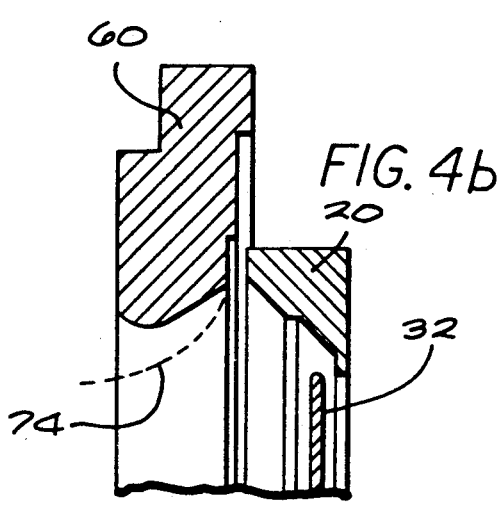

APPARATUS FOR DEPOSITING A THIN LAYER OF SPUTTERED ATOMS ON A MEMBER

This invention relates to apparatus for depositing gaseous molecules on substrates such as wafers for integrated circuit chips. More particularly, this invention relates to apparatus for depositing gaseous molecules in a substantially uniform thickness on a substrate. The invention further relates to apparatus for depositing the gaseous molecules on the substrate with an enhanced density and without any impurities.

Wafers are fabricated with a plurality of dies (sometimes as many as hundreds) on each wafer. Each of the dies on a wafer subsequently forms an integrated circuit chip. The dies are tested while on the wafer to determine if they have been produced properly. The defective dies are marked to distinguish them from the satisfactory dies. The dies are then cut from the wafer and the satisfactory dies are retained for use as integrated circuit chips.

The wafers are produced from a plurality of successive layers, some of electrically conductive material and others of insulating material. When a layer of an electrically conductive material is formed, it generally is produced in a pattern to represent electrical circuitry. To produce this electrical circuitry, a layer of an electrically conductive material is initially deposited on the wafer, hopefully in a substantially uniform thickness. The layer is then masked with a material which is subjected to light in a pattern corresponding to the pattern of the electrical circuitry to be produced. The masking material subjected to the light is impervious to an etching material such as an acid. The remaining portions of the layer are then etched as by an acid. The masking material subjected to the light is then removed from the remaining electrical conductive material in the layer. The electrically conductive material remaining on the wafer defines the electrical circuitry for each die on the wafer.

Apparatus has been in use for some time for depositing gaseous molecules on a wafer to produce a layer of a material defined by the gaseous molecules. The apparatus now in use produces such a deposition by bombarding a target with ions. For example, when a layer of aluminum is to be deposited on a wafer, the target may be made from aluminum. When the target is bombarded with ions of an inert gas such as argon, the target emits sputtered atoms of aluminum. These atoms travel to the wafer and become deposited on the wafer to produce a substantially uniform layer of electrically conductive material on the wafer such as discussed in the previous paragraph.

The apparatus now in use has certain limitations. One disadvantage is that the substrate such as the wafer has to be disposed at a relatively great distance from the target. This causes the sputtered atoms to be deposited on the substrate in other than a substantially uniform thickness. Another disadvantage is that impurities such as water molecules tend to be deposited on the substrate. Deviations from a uniform thickness and impurities at localized positions prevent the substrate from having substantially uniform properties. A further disadvantage is that the sputtered atoms are not deposited on the substrate with optimal density. These disadvantages have existed for some time in spite of considerable efforts to resolve these disadvantages.

In this invention, a target releases electrons toward an anode through a cavity containing neutral gaseous atoms (e.g. argon) having properties of becoming ionized by electron impingement. Magnetic and electrical fields increase the distance of electron travel between the anode and the target, thereby enhancing ion formation from the gaseous atoms. The ions bombard the target and cause it to emit sputtered atoms (e.g. aluminum) which are deposited on a substrate (e.g. wafer) displaced from the target.

In one embodiment, a shield disposed between the target and the substrate is shaped, and has a potential, to attract these charged particles and prevent them from moving to the substrate. This allows the wafer to be disposed close to the target, thereby enhancing the density, and the thickness uniformity, of the deposition on the substrate. The shield also acts as a getter to remove impurities (e.g. water molecules) from the space between the target and the substrate.

In another embodiment, the shield has a positive potential to attract electrons and repel ions, thereby funneling ions toward the substrate. The funnel shape is dependent upon the shield voltage. A hood displaced slightly (e.g. 50 mils) from the shield is shaped, and has a potential (e.g. ground), to attract charged particles near the hood and outside of the funnel. The funneled ions and sputtered atoms are deposited on the substrate to generate heat in the substrate, thereby enhancing the properties of the substrate deposition. Sputtered atoms between the shield and the hood form a dielectric to prevent any voltage breakdown between the shield and the hood.

In the drawings:

FIGS. 2a, 2b and 2c are schematic views illustrating the relative thicknesses of the deposition of the sputtered atoms on the substrate when the target is disposed at different distances from the substrate;

Figure 3:
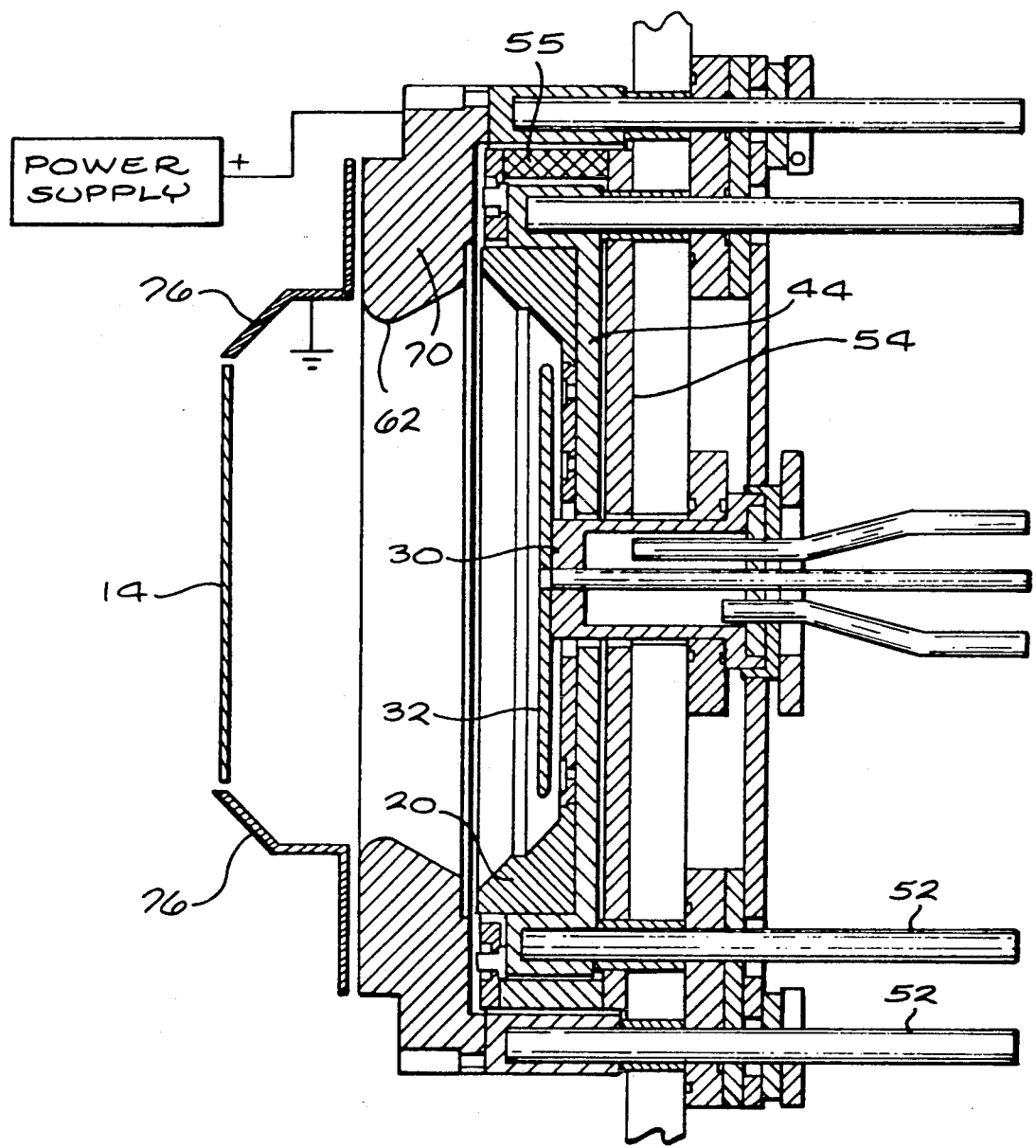

FIG. 3 is a fragmentary sectional view in side elevation of apparatus constituting a second embodiment of the invention for depositing sputtered atoms of a material from a target on a substrate such as a wafer; and FIGS. 4a and 4b are schematic views illustrating the funneling action provided on positively charged ions in the embodiment shown in FIG. 3 when different voltages are applied to a shielding member included in the embodiment shown in FIG. 3.

Figure 1:
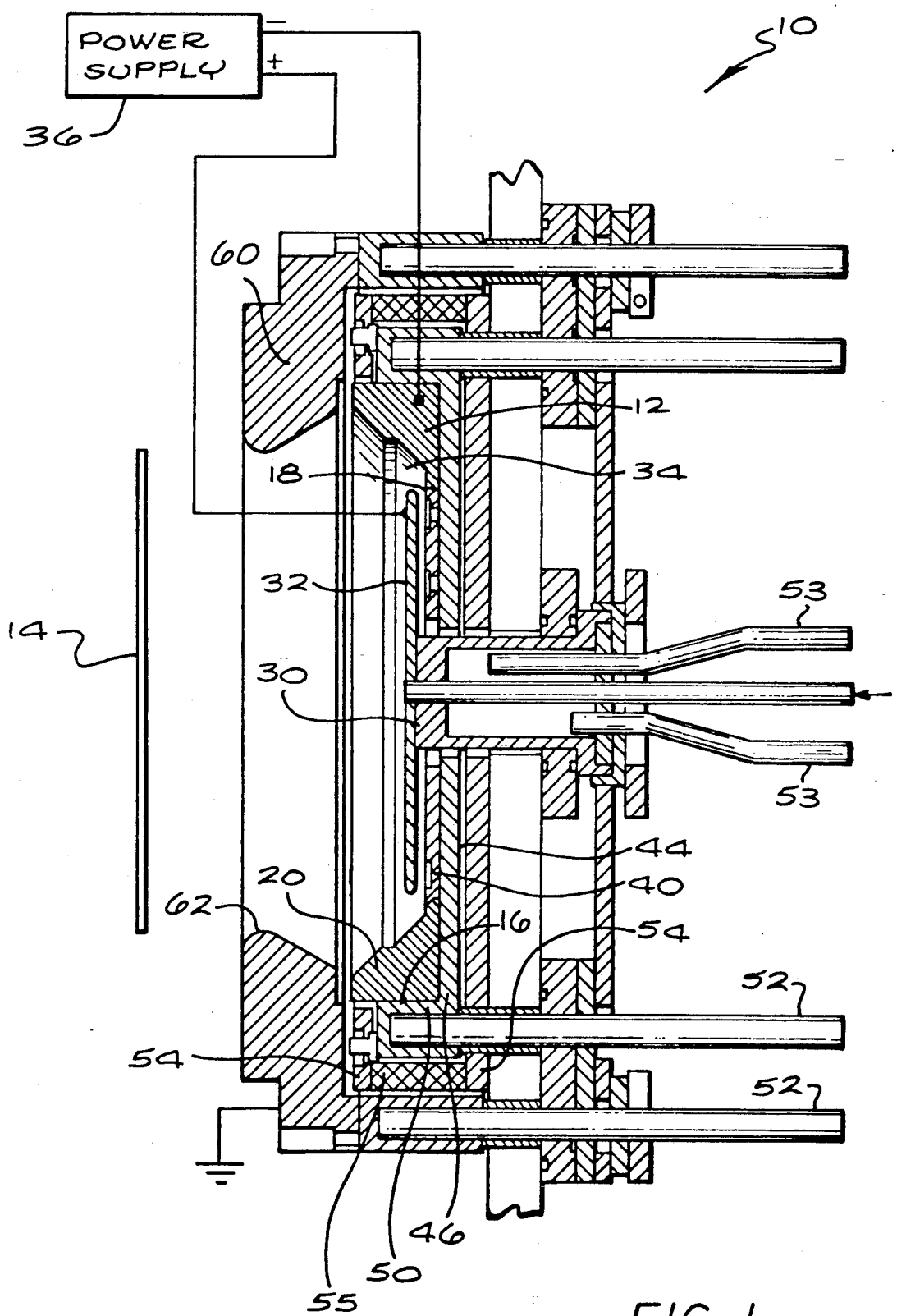
FIG. 1 is a fragmentary sectional view, in side elevation, of apparatus constituting one embodiment of the invention for depositing sputtered atoms of a material from a target on a substrate such as a wafer.

In one embodiment of the invention, apparatus generally indicated at 10 in FIG. 1 is provided for depositing sputtered atoms from a target 12 on a substrate. As one alternative, the substrate may constitute a wafer 14 which is used in the semi-conductor industry. The wafer 14 may be in the form of a thin disc made from a suitable material such as silicon dioxide and having a suitable diameter such as approximately five inches (5''). The wafer may hold a plurality of dies, each of generally identical construction and each forming, when completed, an integrated circuit chip defining complex electrical circuitry. Each die may be quite small (e.g. $\frac{1}{4}'' \times \frac{1}{4}''$) so that a considerable number of dies can be formed on a single wafer.

The target 12 may be a unitary member, preferably with an annular configuration, as shown in FIG. 4. The target 12 may be defined by an annular external periphery 16 and may be provided with a centrally disposed opening defining an internal periphery 18. The target 12 may have a frusto-conical surface 20 with a step in the frusto-conical surface at an intermediate position along the length of the frusto-conical surface. The target 12 may be made from a suitable material such as aluminum or titanium.

The apparatus 10 includes a support member 30 radially separated from the target 12. An anode 32 extends radially from the support member 30. A chamber or cavity 34 is formed between the anode 32 and the target 12. The chamber 34 holds atoms of an inert gas such as argon. The atoms of the inert gas such as argon are introduced to the chamber 34 through an inlet (not shown). An electrical field is provided between the anode 32 and the target 12, which may serve as a cathode, by connecting the anode and target, respectively, to the positive and negative terminals of a power supply 36.

A clamp 40 is disposed in the centrally disposed opening of the target 12 in abutting relationship with the internal periphery 18 of the target. The clamp 40 has a shoulder which overlays the internal periphery 18 of the target 12. The clamp 40 may be made from a suitable material such as copper. The clamp 40 is disposed against a support portion 44 of a cooling member 46 and is attached to the support portion of the cooling member as by screws. The construction of the clamp is fully disclosed in co-pending application Ser. No. 441,647 filed in the United States Patent Office on Nov. 27, 1989, for "Apparatus for Depositing a Thin Layer of Gaseous Molecules on a Member" and assigned of record to the assignee of record of this application.

The cooling member 46 has a portion 50 which abuts the external periphery of the target 12. Passageways 52 and 53 are disposed in the cooling member 46 to provide for the flow of a fluid such as water to cool the cooling member, the clamp 40 and the target 12. A pair of pole pieces 54 enclosing a permanent magnet 55 are disposed relative to the cooling member 46 to create a magnetic field in the chamber 34.

The voltage difference supplied by power supply 36 connected between the anode 32 and the target 12 causes electrons to be released by the target and to travel toward the anode. The electrons move in a spiral path toward the anode 32 because the magnetic field produced in the chamber 34 by the magnets 54 has a component in a direction perpendicular to the electrical field between the anode and the target. Because of this spiral path, the electrons have an ample opportunity to strike argon atoms and to ionize the argon atoms.

The argon ions travel to the frusto-conical surface 20 of the target 12 and cause sputtered atoms to be released from this surface when they impinge on the surface. The sputtered atoms travel to the wafer 14 and become deposited on the wafer. As the target material becomes depleted from the frusto-conical surface 20 of the target 12, the target becomes progressively worn. When the target 12 has become sufficiently worn, the target 12 is removed from the apparatus and is replaced by a new target.

As the sputtered atoms become released from the frusto-conical surface of the target 12, the target becomes heated. This would tend to cause the target to expand at its external periphery 16 in FIG. 1 because of metal migration caused by heat and the pressure of confinement on its external periphery. However, the external periphery 16 of the target 12 is maintained in fixed position by its mechanical abutment with the portion 50 of the cooling member 46 and by the cooling action of the cooling member. This cooling action results from the flow of a cooling fluid each as water through the passageways 52 and 53 in the cooling member 46.

In like manner, the inner periphery 18 of the target 12 is maintained in fixed position by abutment with the clamp 40 and by the cooling action of the cooling member 46. The inner periphery 18 of the target 12 is also maintained in fixed position by the migration of sputtered atoms from the target 12 to the clamp 40. By maintaining the inner and outer peripheries of the target 12 in fixed position, the deposition of the sputtered atoms from the target 12 on the wafer 14 is enhanced. The inner periphery of the target 12 is also maintained in fixed position by the migration of sputtered atoms from the target 12 to the clamp 40. By maintaining the inner and outer peripheries of the target 12 in fixed position, the deposition of the sputtered atoms from the target 12 on the wafer 14 is enhanced.

A shield 60 made from a suitable material such as aluminum is disposed between the target 12 and the wafer 14. The shield 60 is provided with a hollow interior 62 having a suitable configuration such as a frusto-conical configuration defining a funnel with progressive positions toward the wafer 14. The shield 60 may be provided with a suitable potential such as a ground potential.

Because of its ground potential, the shield 60 attracts electrons and positive ions in the space between the target 12 and the wafer 14. Since the charged particles create heat when they impinge upon the wafer 14, the inhibition provided by the shield 60 against the movement of the charged particles to the wafer 14 causes the wafer to be maintained at a relatively cool temperature relative to the temperature of wafers in apparatus of the prior art. This allows the wafer 14 to be disposed closer to the target 12 than in the apparatus of the prior art.

By disposing the wafer 14 relatively close to the target 12, the sputtered atoms from the target can be deposited on the wafer 14 with a greater density than in the apparatus of the prior art. Furthermore, the sputtered atoms can be deposited on the wafer 14 with an enhanced uniformity of thickness relative to the uniformity of thickness provided on the wafer by the apparatus of the prior art. This may be seen from a comparison of the thicknesses of the material deposited on the wafer in the schematic representations of FIGS. 2a, 2b and 2c.

FIG. 2a indicates the thickness of a deposition 64 on the wafer 14 at different cross-sectional positions when the wafer is relatively close to the target 12. As will be seen, the thickness of the deposition 64 is substantially uniform at the different cross-sectional positions. Although there is a decrease in thickness at the center of the wafer 14, any decrease in the thickness at the position of the hole in the wafer 14 has no effect on the uniformity of the deposition thickness since dies are not produced at the center position of the wafer.

FIG. 2b illustrates the thickness of a deposition 66 on the wafer 14 when the wafer is disposed at an intermediate distance from the target 12. As will be seen, the thickness of the deposition 66 is decreased at the periphery of the wafer relative to the deposition thickness closer to the center of the wafer. FIG. 2c illustrates the thickness of a deposition 68 on the wafer 14 when the wafer is disposed at a considerable distance from the target. It will be seen that the thickness of the deposition 68 at the periphery of the wafer is even further decreased from the reduced thickness in the embodiment shown in FIG. 2b.

The embodiment shown in FIG. 1 has another important advantage as a result of the inclusion of the shield 60. When the argon atoms are introduced into the space between the anode 32 and the target 12 through the inlet 35, impurities are also introduced through the inlet. These impurities may illustratively include water molecules. In the prior art, these water molecules have become attached to positive ions and have been deposited with the ions on the wafer 14. These impurities such as water molecules have created imperfections or blemishes on the surface of the wafer. These imperfections or blemishes often prevent the dies holding the imperfections or blemishes from operating satisfactorily. This has been particularly true as the micron thickness has progressively decreased until now the thickness of the electrical leads in the dies is less than one micron (1 u).

The shield 60 included in the embodiment shown in FIG. 1 is effective in removing the impurities such as water molecules from the space between the target 12 and the wafer 14. This results from the deposition of the water molecules on the positive ions and the attraction of the positive ions to the shield 60. When the water molecules reach the surface of the shield 60, they become disassociated to hydrogen atoms and oxygen ions. The hydrogen atoms combine to form hydrogen molecules which are pumped from the space between the target 12 and the wafer 14 with the argon molecules to create a vacuum and a fresh supply of argon molecules in this space.

The oxygen ions combine with the aluminum on the surface of the shield 60 to form aluminum oxide ($Al_2O_3$). Since aluminum oxide is an electrical insulator, it could inhibit the action of the shield 60 in attracting electrons and positive ions. However, aluminum ions are deposited on the surface of the shield 60 at a faster rate than the formation of aluminum oxide since the amount of impurities in the space between the target 12 and the wafer 14 is relatively low. In this way, a fresh surface of aluminum is constantly deposited on the surface of the shield 60 to cover any aluminum oxide formed on this surface.

The embodiment shown in FIG. 3 also includes a shield 70 similar to the shield 60. However, the shield 70 is at a positive potential rather than ground. This causes the shield 70 to attract electrons and to repel positive ions. A funnelling action is accordingly produced by the shield 70 on the positive ions. A relatively shallow funnel 72 is produced when the magnitude of the positive voltage on the shield 70 is relatively low. This is indicated in FIG. 4a. A sharply defined funnel 74 (FIG. 4b) is produced when the magnitude of the positive voltage on the shield 70 is relatively high. As will be appreciated, the characteristics of the funnel can be controlled by adjusting the magnitude of the positive voltage on the shield 70.

A hood 76 is also included in the embodiment shown in FIG. 3. The hood 76 may be at a suitable potential such as ground to attract electrons and also to attract positive ions near the hood. These positive ions may be displaced from the funnel 72 in FIG. 4a or the funnel 74 in FIG. 4b. In this way, the hood 76 operates to sharpen or focus the funnel and prevent blurring of the funnel. The hood 76 is displaced by a relatively short distance (e.g. 50 mils) from the shield 70. Molecules of the neutral gas such as argon disposed in the space between the hood 76 and the shield 70 provide a dielectric to prevent a voltage breakdown between the hood and the shield.

The positive ions moving in the funnel to the wafer 14 act to enhance the "bias sputtering" of the deposition as the thickness of the deposition increases, thereby helping to distribute the impinging gaseous molecules evenly over the surface of the wafer. Heat is also generated by the absorption of kinetic energy of these ions, about 50 ev for each ion. This heat can contribute as much as 600° C. temperature rise to the deposition as the thickness of the deposition increases. This elevated temperature is beneficial in obtaining a deposition with optimal characteristics including optimal chemical characteristics, on the wafer 14.

The creation of the elevated temperature on the embodiment shown in FIG. 3 offers certain advantages over the prior art. In the prior art, the elevated temperature at the deposition surface of the wafer is produced by disposing a heater at the rear surface of the wafer. As will be appreciated, this is disadvantageous because the temperature at the deposition surface of the wafer cannot be accurately controlled by generating heat at the opposite surface of the wafer. This is particularly true since the distance between the deposition surface and the opposite surface varies as the deposition process progresses.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a deposition of sputtered atoms on a substrate,
    an anode,
        a target spaced from the anode to serve as a cathode, the target having properties of emitting sputtered atoms when bombarded by gaseous ions and of directing the sputtered atoms to the substrate,
        means for defining a cavity between the anode and the target for receiving atoms of an inert gas,
        means disposed relative to the anode and the target for obtaining an emission of electrons from the target to ionize the atoms of inert gas in the cavity and for obtaining a movement of the ions to the target to obtain the emission of sputtered atoms from the target toward the substrate, and
    means disposed relative to the target and the substrate for shielding the movement of charged particles toward the substrate from the target the shielding means being shaped to funnel the sputtered atoms of the material from the target toward the wafer for deposition on the wafer.

2. In a combination as set forth in claim 1,
    the shielding means being disposed between the target and the substrate and being provided with a voltage relative to the charged particles in the space between the target and the substrate to attract such charged particles to the shielding means.

3. In a combination as set forth in claim 2,
    the shielding means being at ground potential to attract electrons and ions constituting the charged particles.

4. In combination for obtaining a deposition of sputtered atoms on a substrate,
    an anode, a target displaced from the anode to define with the anode a cavity for receiving atoms of a neutral gas in the cavity, means for providing a positive potential on the anode to obtain the emission of electrons from the target and the ionization by such electrons of atoms of the neutral gas in the cavity, means for providing a negative voltage on the target relative to the charges of the ions to attract the ions and obtain the emission from the target toward the wafer of sputtered atoms of the target material, shielding means disposed between the target and the substrate and shaped to define the peripheral boundary of the space between the target and the substrate for a controlled movement of the sputtered atoms of the target material from the target to the substrate for deposition on the substrate, and means for applying a voltage on the shielding means relative to the charged particle in the space between the target and the substrate for controlling the movement of charged particles to the substrate, the target having a central opening defining an internal periphery in the target and having an external periphery, means disposed in abutting relationship with the target at the internal periphery in the target for clamping the target, means disposed in abutting relationship with the target at the external periphery of the target and with the clamping means for cooling the target at the external and internal peripheries of the target, and means associated with the anode and the target for enhancing the movement of the electrons between the anode and the target to facilitate the production of ions for movement to the target, the shielding means being provided with an opening of progressively decreasing dimensions at progressive positions toward the substrate to funnel the movement of the sputtered atoms of the target material from the target to the substrate.

5. In a combination as set forth in claim 4,
the shielding means being responsive to the voltage from the voltage means to inhibit the movement of charged particles to the substrate.

6. In combination for obtaining a deposition of sputtered atoms on a substrate,
an anode,
a target spaced from the anode to define a cavity between the anode and the target,
means for introducing atoms of a neutral gas into the cavity defined by the anode and the target,
means for producing electrical and magnetic fields between the anode and the target to obtain the release of electrons from the target, the movement of the electrons in a spiral path between the anode and the target, the ionization of the atoms of the neutral gas by the electrons, the movement of the resultant ions to the target for the release of sputtered atoms of the target material from the target and the movement of such sputtered atoms toward the substrate,
the electrons and the ions constituting charged particles,
the target being shaped to direct the sputtered atoms of the target material in a converging path toward the substrate,
shielding means disposed between the target and the substrate and shaped relative to the converging path defined by the target to facilitate the converging movement of the sputtered atoms of the target material to the substrate, and
means for applying a voltage to the shielding means relative to the potential of the charged particles for controlling the movement of the charged particles in the space between the target and the substrate.

7. In a combination as set forth in claim 6,
the shielding means including first and second members, the first member being closer to the target then the second member,
the first member receiving a potential to attract electrons and repel ions for movement to the substrate to create heat in the substrate,
the second member being substantially at a potential to attract electrons and ions close to the second member.

8. In a combination as set forth in claim 7,
the first and second members being spaced from each other by a distance to provide for the disposition of atoms of the neutral gas in the space between the first and second members to provide a dielectric between the first and second members.

9. In a combination as set forth in claim 8,
the target having a central opening defining an internal periphery and having an external periphery,
means for clamping the target at the internal periphery, and
means for cooling the target at the external and internal peripheries of the target.

10. In a combination as set forth in claim 7,
the first and second members being spaced from each other by a distance to provide for the disposition of atoms of the neutral gas in the space between the first and second members as a dielectric between the first and second members,
the target having a central opening defining an internal periphery and having an external periphery
means for clamping the target at the internal periphery, and
means for cooling the target at the external and internal peripheries of the target.

11. In a combination as set forth in claim 6,
the means for applying a voltage to the shielding means relative to the potential of the charged particles being operative to obtain an attraction of charged particles to the shielding means in the space between the target and the substrate.

12. In a combination as set forth in claim 6,
the shielding means being responsive to the voltage from the voltage means to inhibit the movement of charged particles to the substrate.

13. In combination for providing a deposition of sputtered atoms on a substrate,
an anode,
a target spaced from the anode,
means for introducing atoms of a neutral gas into the space between the anode and the target,
means associated with the anode and the target for obtaining a release of electrons by the target and the movement of the electrons in a path toward the anode for the ionization of atoms of the neutral gas by the electrons and the movement of the ions of the neutral gas to the target for the emission of sputtered atoms of the material of the target and the movement of the sputtered atoms toward the substrate, and shielding means disposed and shaped relative to the anode and the target and provided with a potential to funnel the sputtered atoms from the target to the substrate for deposition on the substrate.

14. In a combination as set forth in claim 13,
the target being disposed relative to the substrate to enhance the density of the deposition of the sputtered atoms on the substrate.

15. In a combination as set forth in claim 13,
the shielding means being constructed to attract electrons and to funnel ions to the substrate for the deposition of the ions on the substrate and the generation of heat in the substrate during such deposition and to funnel sputtered atoms to the substrate for deposition on the substrate.

16. In a combination as set forth in claim 15,
the target being disposed relative to the substrate to enhance the density of the deposition of the sputtered atoms on the substrate,
the target having a central opening to define an internal periphery and having an external periphery,
means for clamping the target at the internal periphery, and
means for clamping the target at the external periphery and for cooling the target.

17. In combination for providing a deposition of sputtered atoms on a substrate,
an anode,
a target spaced from the anode to serve as a cathode, the target having properties of emitting sputtered atoms when bombarded by gaseous ions and of directing the sputtered atoms to the substrate,
first means for introducing atoms of a neutral gas into the space between the anode and the target,
second means disposed relative to the anode and the target for obtaining an emission of electrons from the target to ionize the atoms of the neutral gas in the space between the anode and the target and for obtaining a movement of the ions to the target to obtain the emission of sputtered atoms of the material of the target toward the substrate,
third means disposed relative to the target and the substrate for attracting electrons and repelling ions and for funneling the ions and the sputtered atoms to the substrate, and
fourth means disposed relative to the target and the substrate and the third means for enhancing the funneling action provided by the third means on the sputtered atoms.

18. In a combination as set forth in claim 17,
the fourth means having a different potential than the third means and being disposed relative to the third means such that atoms of the neutral gas provide a dielectric between the third and fourth means to prevent a voltage breakdown between the third and fourth means.

19. In a combination as set forth in claim 18, the third means having a positive potential, the fourth means being at ground potential, the shape of the funneling action being dependent upon the magnitude of the positive potential on the third means.

20. In a combination as set forth in claim 19, the third means constituting a shield shaped to provide a progressive funneling action from the target to the substrate and the fourth means constituting a hood shaped to enhance the funneling action provided by the third means.

* * * * *